(12) United States Patent
Rempe et al.

(10) Patent No.: US 7,871,198 B2
(45) Date of Patent: Jan. 18, 2011

(54) HIGH-TEMPERATURE THERMOCOUPLES AND RELATED METHODS

(75) Inventors: Joy L. Rempe, Idaho Falls, ID (US);
Darrell L. Knudson, Firth, ID (US);
Keith G. Condie, Idaho Falls, ID (US);
S. Curt Wilkins, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 984 days.

(21) Appl. No.: 11/678,901

(22) Filed: Feb. 26, 2007

(65) Prior Publication Data

US 2008/0205483 A1 Aug. 28, 2008

(51) Int. Cl.
*G01K 7/00* (2006.01)
*G01K 1/00* (2006.01)

(52) U.S. Cl. .................. 374/179; 374/208; 136/230; 136/232

(58) Field of Classification Search ............... 374/179, 374/208; 136/232, 230
See application file for complete search history.

(56) References Cited

U.S. PATENT DOCUMENTS

| | | | | | |
|---|---|---|---|---|---|
| 1,837,853 | A | * | 12/1931 | De Florez | 374/107 |
| 2,587,391 | A | | 2/1952 | Seaver | |
| 3,395,051 | A | * | 7/1968 | Pisarz | 136/233 |
| 3,538,596 | A | * | 11/1970 | Davis et al. | 136/230 |
| 3,867,205 | A | * | 2/1975 | Schley | 136/232 |
| 4,412,090 | A | * | 10/1983 | Kawate et al. | 136/230 |
| 6,550,963 | B2 | | 4/2003 | Daily et al. | |
| 2002/0088640 | A1 | | 7/2002 | Schuh et al. | |

OTHER PUBLICATIONS

International Search Report and Written Opinion of the International Searching Authority, International Application No. PCT/US07/83130, International Filing Date Oct. 31, 2007.
Rempe, J.L., et al., Dec. 2006. "Thermocouples For High-Temperature In-Pile Testing," Nuclear Technology, vol. 156, Dec. 2006, pp. 320-331.
Rempe, J.L., and Wilkins, S.C., "Specialized Thermocouples for High Temperature In-situ Applications," Jan. 2005, Idaho National Engineering and Environmental Laboratory.
Rempe, J.L. et al., "Thermocouples for High Temperature In-Pile Testing," Idaho National Laboratory.
Rempe, J.L., "High Temperature Thermocouples For In-Pile Applications," The 11th International Topical Meeting on Nuclear Reactor Thermal-Hydraulics (NURETH-11), Avignon, France, Oct. 2-6, 2005. pp. 1-12.
Rempe, J. et al., "Development and Evaluation of High Temperature Thermocouples for In-Pile Applications," American Nuclear Society Winter Meeting, Washington, D.C., Nov. 13-17, 2005.

(Continued)

*Primary Examiner*—Lisa M Caputo
*Assistant Examiner*—Mirellys Jagan
(74) *Attorney, Agent, or Firm*—TraskBritt

(57) ABSTRACT

A high-temperature thermocouple and methods for fabricating a thermocouple capable of long-term operation in high-temperature, hostile environments without significant signal degradation or shortened thermocouple lifetime due to heat induced brittleness.

27 Claims, 3 Drawing Sheets

OTHER PUBLICATIONS

Rempe, J. et al., "Development and Evaluation of High Temperature Thermocouples for In-Pile Applications," American Society of Testing and Measurement Committee E20 Meeting, Dallas, TX, Nov. 2005.

Fanciullo, Salvatore, "Thermocouple Development," AEC Research and Development Report (entire report), Issued Mar. 5, 1964.

Holmes, Robert R., "Development of High Temperature Sensors," AEC Research and Development Report (entire report), Issued Jun. 30, 1961.

Fornwalt, D.E., et al., "A Study of the Compatibility of Selected Refractory Metals with Various Ceramic Insulation Materials," presented at Electron Microprobe Symposium of Electromechanical Society Meeting, Washington, D.C., Oct. 1964.

* cited by examiner

HIGH-TEMPERATURE THERMOCOUPLES AND RELATED METHODS

GOVERNMENT RIGHTS

This invention was made with government support under Contract No. DE-AC07-05ID14517 awarded by the United States Department of Energy. The government has certain rights in the invention.

TECHNICAL FIELD

This invention relates to a thermocouple design and fabrication and more specifically to a high-temperature thermocouple capable of long-term operation in hostile high-temperature environments without significant signal degradation.

BACKGROUND

The accurate measurement of temperatures between 1100° C. and 1700° C. is important to the safe, efficient and economical operation of many industries such as electrical power production, processing and refining of chemicals, the fabrication of steel and other metals, and production of glass and ceramic materials. Accurate temperature measurement over time can also be critical to the operation of industrial machinery such as jet engines, nuclear reactors, gasification units, incinerators, and gas turbines. In such temperature environments, thermocouples are the most widely used industrial temperature sensors because they are rugged, affordable and accurate—at least initially.

Unfortunately, after installation all commercial thermocouples are unstable in this temperature range and prone to decalibration or "drift," providing increasingly unreliable and unpredictable readings as they age. As operating temperatures and thermal cycles increase, the performance of these thermocouples decreases. Together, these factors often result in costly redundant instrument clusters, sensor failures, downtime and potential accidents due to undetected overheating. For temperatures above 1100° C. in radiation environments, such as in high-temperature nuclear test reactors, conventional thermocouples are incapable of stable and accurate operation.

The thermocouple of the present invention overcomes the two most critical thermocouple issues plaguing high-temperature operations; signal drift and sensor longevity. The first problem with all conventional thermocouple sensors is that they are subject to decalibration. The uncertainties surrounding decalibration are difficult to quantify, but elevated temperatures and longer operating times inevitably result in increasingly unreliable measurements. Standard thermocouples drift appreciably after a few hundred hours of use, making accurate temperature measurement and high-temperature process control difficult without frequent sensor change out. For high-temperature nuclear applications there are even greater limitations. Currently there are no high-temperature thermocouples capable of withstanding neutron flux in nuclear fission reactors or, potentially one day, fusion reactors. The key to minimizing drift lies in selecting thermocouple materials with properties that do not interact with each other or appreciably change during use.

A second problem is that prolonged heating, contamination, and thermal cycling increases brittleness and fragility and shortens thermocouple life. Most metals, including those used in thermocouples, become brittle with high-temperature exposure; as a result, they can fail due to mechanical stresses induced by vibrations, expansion, and contraction. Heat from welding to form standard thermocouple junctions also can lead to mechanical failure from embrittlement. Compatibility of component metals at high temperature and improved joining methods are essential to improved thermocouple durability.

It is an object of the invention to provide a high-temperature thermocouple capable of operating in hostile environments for a long period of time without significant signal degradation.

It is another object of the invention to provide a method of fabricating a high-temperature thermocouple capable of operating in hostile environments for a long period of time without significant signal degradation.

It is still a further object of the invention to provide a thermocouple capable of operating in a temperature range of 1100° C. to 1700° C. in a radiation environment.

Additional object, advantages and novel features of the invention will become apparent to those skilled in the art upon examination of the following and practice of the invention.

SUMMARY

Embodiments of the present invention relate to a design and method for fabricating a thermocouple capable of operating for long periods of time in a high-temperature, hostile environment without significant signal degradation. Embodiments of the invention include providing two dissimilar thermoelement wires having high melting temperatures, high ductility and low neutron cross-sections. The thermoelement wires are joined at one end by swaging a metallic tube over the ends of the thermoelement wires to form a thermocouple junction. In one embodiment of the invention the thermoelement wires and junction with the insulation are heated to remove moisture and impurities. The swaged thermocouple junction helps avoid failure due to embrittlement associated with conventional junction forming techniques. This junction is also resistant to breakage due to metal fatigue and brittleness cause by operating at high temperatures for long periods of time. Embodiments of the invention utilize insulating materials that are not reactive with the thermoelement wires or metallic sheath. In one embodiment of the invention a less porous insulating material is used to provide an interface with the insulating material surrounding the thermocouple junction. A metallic sheath is loaded with the insulating materials, thermoelement wires and thermocouple junction, and then the metallic sheath is swaged to provide intimate contact between the insulating materials and the thermoelement wires and thermocouple junction. The interface between the insulating materials is determined and the less porous insulating material is physically removed by cutting the thermocouple sheath at a location between the junction and the interface. The sheath is then capped to provide a leak-tight thermocouple. The thermocouple is then heated to a temperature for a sufficient time to stabilize grain structure.

In one embodiment of the invention, the thermoelement wires are a doped molybdenum and niobium/zirconium alloy. For example the dopants of the molybdenum thermoelements are tungsten, potassium and silicon in amounts typically ranging from 100 to 300 parts per million. The niobium/zirconium alloy is 99% by weight niobium and 1% by weight zirconium. The metallic sheath is also comprised of the same niobium/zirconium alloy.

BRIEF DESCRIPTION OF THE DRAWINGS

Illustrative embodiments of the invention are shown in the drawings in which.

DETAILED DESCRIPTION

Figure 1:
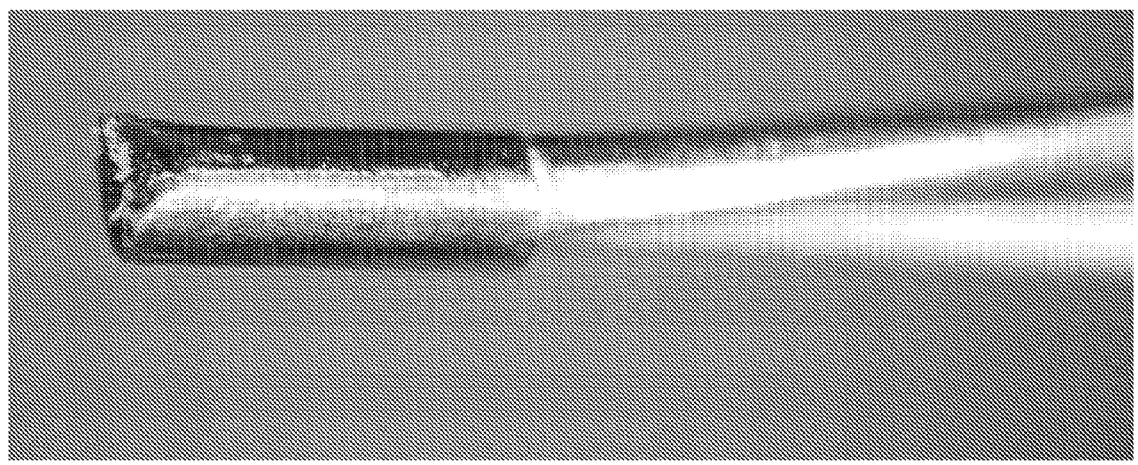
FIG. 1 is a photograph showing a thermocouple junction comprising a metallic tube swaged onto thermoelement wires.

Referring now to the drawings in which like numerals represent like elements throughout the several views, embodiments of the present invention will be described.

The present invention employs a thermoelement wire combination of doped molybdenum and niobium/1% zirconium alloy with a sheath of the same niobium/1% zirconium. The molybdenum is doped with the elements tungsten, potassium, and silicon (typically dopants are present in the range of 100-300 ppm). Molybdenum is an excellent refractory metal but recrystallizes upon heating above 1200° C. The doped molybdenum selected for the present invention remains ductile after heating for 12 hours at 1800° C. Niobium has excellent ductility, a high melting temperature, and low neutron absorption. Alloying the niobium with zirconium increases its recrystallization temperature. Importantly, molybdenum and niobium are both less expensive than the metals used for conventional high-temperature tungsten/rhenium or platinum/rhodium thermocouples. Hence, in an embodiment of the invention, these thermoelement materials are selected based on factors such as cost, melting temperature, ductility, and low neutron cross-section.

During fabrication, care must be taken to avoid contaminating the thermoelement wires, metallic junction tube, and sheath. This is accomplished by cleaning these components with a solvent, such as acetone, and handling the components with gloves.

Referring now to FIG. 1 a photograph of a metallic tube swaged onto the thermoelement wires to form a thermocouple junction is shown. The use of swaged metallic tubes, such as tantalum tubes, to form the junction eliminates the requirement of a welded junction, which have a tendency to become brittle and mechanically unstable at higher temperatures.

Embodiments of the present invention may include hafnium dioxide ($HfO_2$) insulation paired with doped molybdenum and niobium-zirconium alloy. When pairing hafnium dioxide ($HfO_2$) and niobium-zirconium alloy, tests indicate no discernible interactions up to at least 1600° C. (and material properties suggest that higher temperatures are viable). The chemical stability of the thermocouple/insulation pairing contributes to signal stability of the present invention. The insulating material of a thermocouple must have high electrical resistivity and must not interact chemically with the thermoelement wires or sheath materials. Even small changes it thermoelement composition can result in decalibration. This is often due to temperature-induced migration of impurities from the sheath and insulation to the thermoelement wires. For standard thermocouples, metal/insulation interactions are one cause of drift, but at 1600° C., reaction kinetics make material interactions difficult to avoid. Clearly, minimizing component material interactions aids in minimizing thermocouple drift.

The electrical insulating materials are heated in a desiccator at a high temperature for a sufficient time to outgas impurities and moisture. The insulation may be heated to a temperature of at least 120° C. for at least 24 hours. Heating at a higher temperature will reduce the period of time needed for heating the insulating material.

Figure 2:
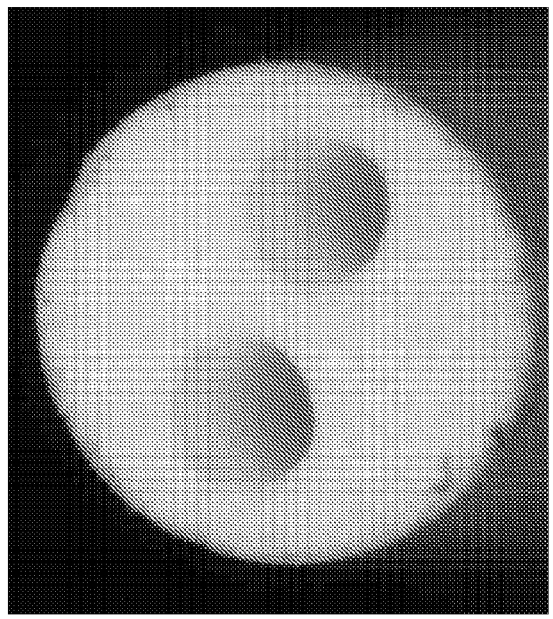
FIG. 2 is a photograph showing an electrical insulating material having two interior passageways.
Figure 3:
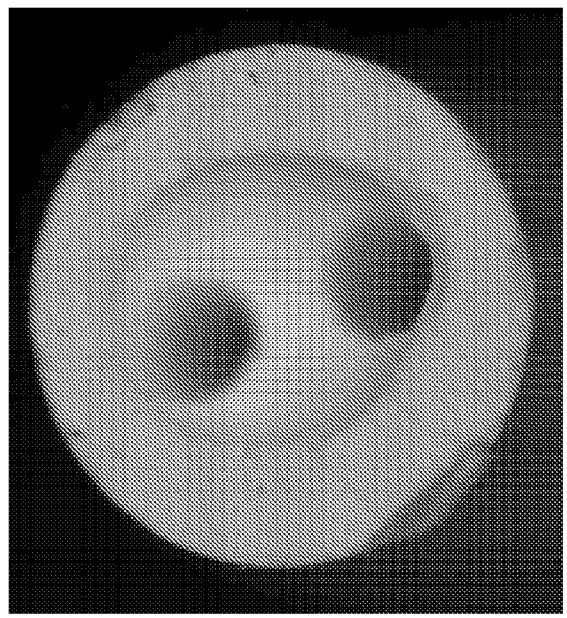
FIG. 3 is a photograph showing a second electrical insulating material having a hollowed out void to receive the swaged junction.

FIG. 2 shows the insulating material having two interior passageways through which the ends of the thermoelement wires are threaded. FIG. 3 is a photograph of a second insulating material in which a void has been created by hollowing out an interior portion of the insulating material. The void is formed to receive the thermocouple junction.

Figure 4:
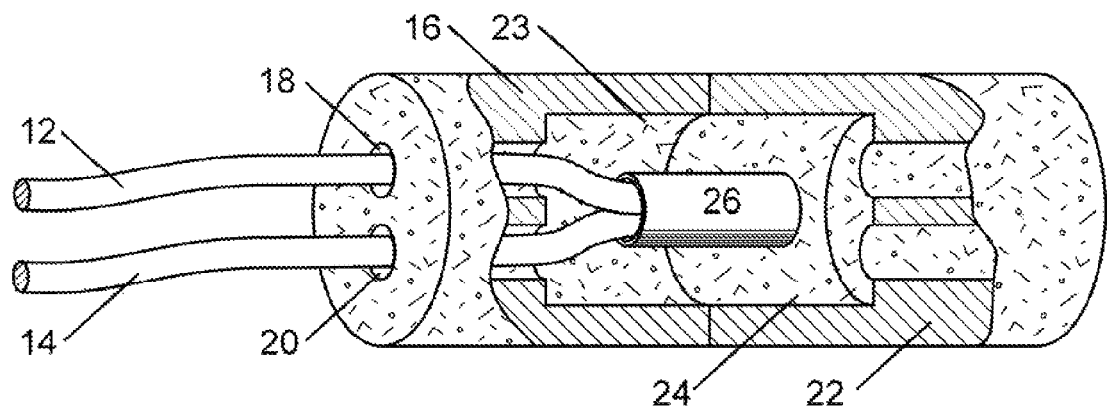
FIG. 4 is a sectional drawing illustrating the thermoelement wires, thermocouple junction and insulating materials.

A sectional drawing of the invention is shown in FIG. 4 that illustrates a doped molybdenum thermoelement wire 12 and a niobium/1% zirconium thermoelement wire 14 that have been threaded through the first insulation material 16 passageways 18 and 20. The first insulating material 16 is in contact with a second insulating material 22. The first insulating material 16 has a void 23 formed to receive the junction after the wires 12, 14 are threaded into passageways 18 and 20. The second insulating material 22 has a void 24 formed therein for receiving a thermocouple junction 26.

Figure 5:
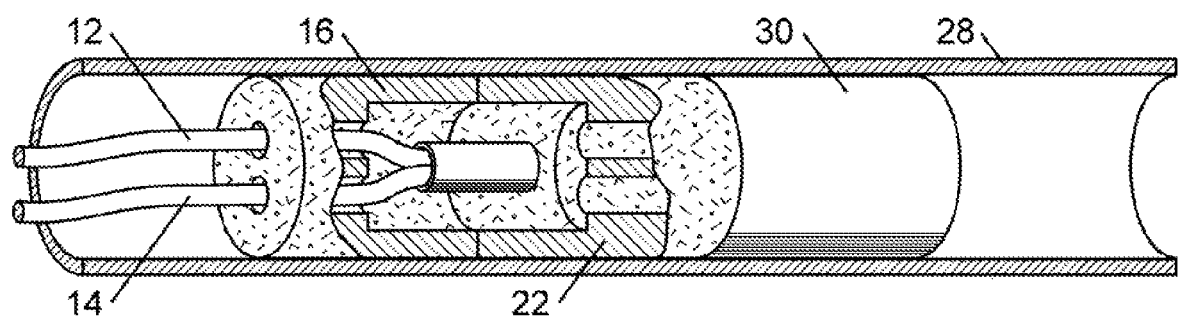
FIG. 5 is a sectional drawing illustrating the thermoelement wires, thermocouple junction and insulating materials within a metallic sheath.

FIG. 5 is a sectional drawing showing the first and second insulating materials 16 and 22 respectively, containing the thermoelement wires 12 and 14 within a metallic sheath 28. In contact with the second insulating material 22 within the sheath 28 is a third insulating material 30. Sheath 28 is comprised of a material that does not react with the insulating materials. Sheath 28 may be a niobium/zirconium alloy, such as a 99% niobium/1% zirconium alloy. The third insulating material 30 is comprised of a material that is less porous than the first and second insulating materials 16 and 22. For example, the third insulating material 30 may be comprised of aluminum oxide (hereafter "alumina").

After insulators are threaded onto the thermoelement wires 12 and 14, the assembly is loaded into the Nb 1% Zr sheath. A piece of hafnium dioxide (hereafter "hafnia") insulating material 22 with a void 24 is used to cover the junction. Then, a piece of alumina insulation material 30 is placed above the hafnia insulation material 22 to facilitate swaging. Experience indicates that the less porous alumina prevents undesirable crushing of the junction and thermoelement wires observed when only hafnia is placed within the sheath. The sheath containing the junction, wire, and insulation assembly is placed in an oven and baked for at least 8 hours at 120° C.

The sheath 28 containing the thermoelement wires 12 and 14 and insulating materials is then swaged to provide intimate contact between the thermoelement wires 12 and 14, thermocouple junction 26 and the insulating materials 16 and 22. The swaging step results in a repositioning of the interface between the second insulating material 22 and third insulating material 30. The interface between the second and third insulating materials 22 and 30 can be ascertained by means of an x-ray imaging system or other radiography techniques. In the present invention, the thermocouple is cut orthogonally to its longitudinal axis at a location between the junction and this interface between the insulating materials. The end is then prepared for receiving an end cap (not shown) by sanding the end of the sheath 28 flat. The end cap consists of a niobium plug that is then laser welded to the cut end of the sheath 28.

The thermocouple is then checked for leak-tightness using a helium leak detection system. As a final step in the fabrication of the present thermocouple invention, a length that will encompass the anticipated length that will see a temperature gradient during its planned operating conditions is inserted into a tube furnace and heat treated at an appropriate temperature above the anticipated service temperature, for a sufficient duration to ensure assure stable response. The thermocouple is typically heated at least 100° C. above its planned service temperature for at least 3 hours.

Figure 6:
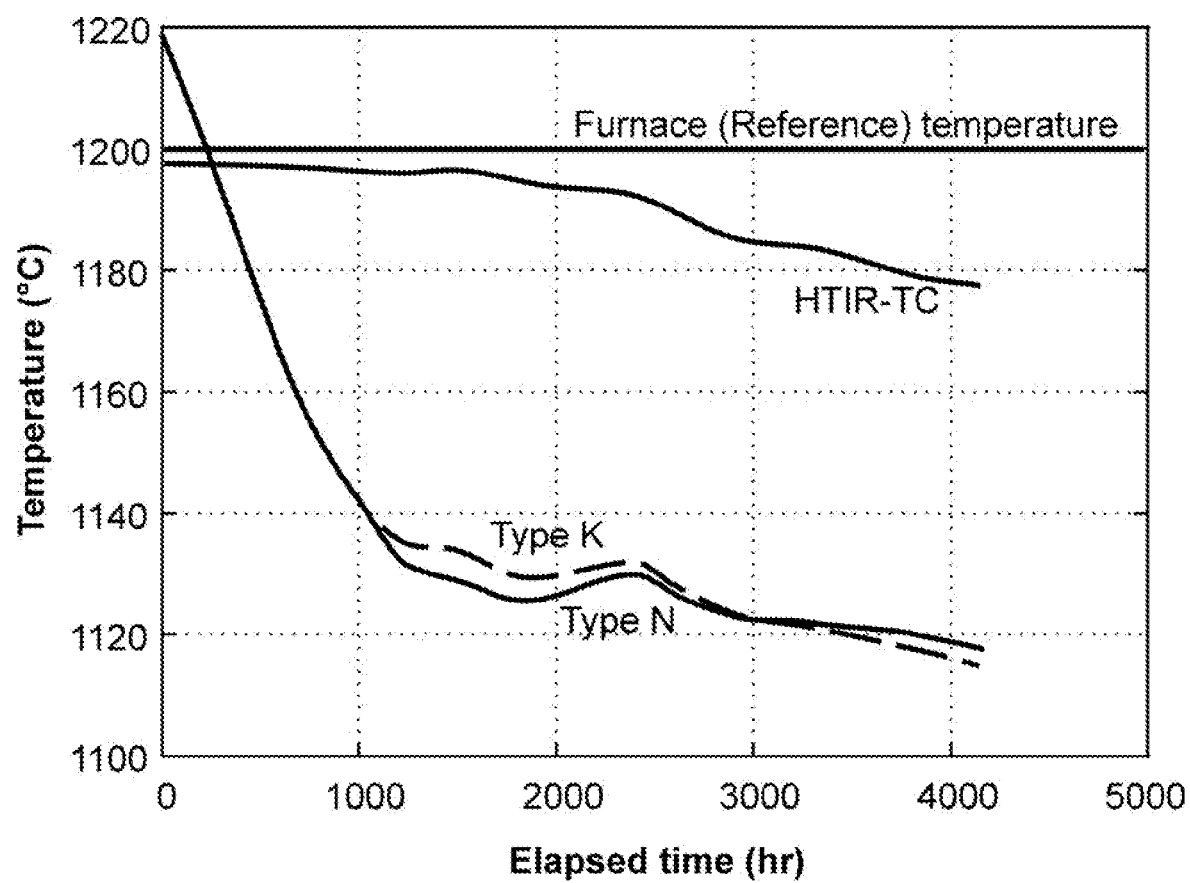
FIG. 6 is a graph showing the measured temperature over a period of time of the present invention and conventional Type K and Type N thermocouples.

Long duration tests in a high-temperature furnace at the Idaho National Laboratory (INL) demonstrate that the present invention remains stable with less than 2% drift after operating 4,000 hours at 1200° C. (see FIG. 6). Compare this with the leading commercially available Type N and K thermocouples often used for this temperature range that began to drift beyond 2% after only 200 hours at temperature. The present invention offers a twenty-fold performance improvement in resistance to drift over this current technology. Similarly, less than 2% drift was observed in present invention tested at 1400° C. for 4,000 hours, well beyond the use range for Type N and K thermocouples.

For temperature ranges from 1100° C. to 1700° C., the present invention competes well with more expensive tungsten-rhenium or platinum-rhodium thermocouples that are prone to failure after prolonged temperature exposure and repeated thermal cycling. The enhanced performance of the present invention is due to the ductility of its component metals and the unique thermoelement joining method that results in a rugged sensor, offering significantly longer, more stable service. The result is fewer open-circuit failures (from fractures in the thermoelement wires or at the junction) common to high-temperature thermocouples. Finally, because the present invention is made from metals with very low thermal neutron cross-sections, it can be used in nuclear reactors without suffering decalibration due to neutron-induced transmutation.

At temperatures above 1100° C., the present invention is a superior replacement for currently installed Type K and N thermocouples with improved reliability, accuracy and longevity. At higher temperatures (1100° C. to 1700° C.) the invention offers even more advantages and can be more durable and less prone to drift than competing Type B, C, D, R, or S thermocouples. All of this can be achieved for a lower projected per-unit price. The thermocouple of the present invention performs well in this critical gap where other sensors often fail. Furthermore, the invention is well suited for control of long-duration, high-temperature processes with frequent thermal cycling that often causes competing sensors to fail. For the nuclear industry, the present invention thermocouple offers clear advantages for affordable and reliable in-pile high-temperature monitoring.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of manufacturing a thermocouple, comprising:
forming a thermocouple junction between a first thermoelement wire and a second thermoelement wire formed from thermoelectrically dissimilar materials by swaging a metallic tube onto a first end of the first thermoelement wire and a first end of the second thermoelement wire;
threading the first thermoelement wire through a first longitudinal passageway formed in a first electrical insulating material and threading the second thermoelement wire through a second longitudinal passageway formed in the first electrical insulating material;
disposing the first electrical insulating material, a second electrical insulating material, and a third electrical insulating material having a different density than the first electrical insulating material and the second electrical insulating material in a sheath, comprising:
interfacing the third electrical insulating material with the second electrical insulating material; and
positioning the thermocouple junction within a void formed in the first electrical insulating material and another void formed in the second electrical insulating material;
swaging the sheath so that the first electrical insulating material and the second electrical insulating material contact the first thermoelement wire, the second thermoelement wire, and the thermocouple junction;
determining a location of the interface between the second electrical insulating material and the third electrical insulating material;
cutting the thermocouple between the thermocouple junction and the interface between the second electrical insulating material and the third electrical insulating material to form a sheath end; and
capping the sheath end with an end plug.

2. The method of claim 1, further comprising heating the first electrical insulating material, the second electrical insulating material, and the third electrical insulating material at a sufficient temperature and time to remove moisture contained therein.

3. The method of claim 1, further comprising forming the first electrical insulating material and the second electrical insulating material from hafnia.

4. The method of claim 1, further comprising forming the third electrical insulating material from alumina.

5. The method of claim 1, wherein determining a location of the interface between the second electrical insulating material and the third electrical insulating material comprises determining the location of the interface between the second electrical insulating material and the third electrical insulating material with an x-ray imaging system.

6. The method of claim 1, wherein capping the sheath end with an end plug comprises laser welding a niobium plug onto the sheath end.

7. The method of claim 1, further comprising heating the first thermoelement wire, the second thermoelement wire, the first electrical insulating material, the second electrical insulating material, and the third electrical insulating material at a sufficient temperature and time to remove moisture contained therein.

8. The method of claim 7, further comprising heating the thermocouple to at least 100° C. above a planned service temperature of the thermocouple for at least three hours to stabilize a grain structure of the thermocouple.

9. The method of claim 1, further comprising forming the first thermoelement wire from molybdenum doped with elements selected from the group consisting of tungsten, potassium, and silicon.

10. The method of claim 9, wherein forming the first thermoelement wire from molybdenum doped with elements selected from the group consisting of tungsten, potassium, and silicon comprises forming the molybdenum with doped elements that are present in amounts ranging from between 100 parts per million to 300 parts per million.

11. The method of claim 1, further comprising forming the second thermoelement wire from a niobium and zirconium alloy.

12. The method of claim 11, wherein forming the second thermoelement wire from a niobium and zirconium alloy comprises forming the niobium and zirconium alloy from 99% by weight niobium and 1% by weight zirconium.

13. The method of claim 1, further comprising forming the sheath from a niobium and zirconium alloy.

14. The method of claim 13, wherein forming the sheath from a niobium and zirconium alloy comprises forming the niobium and zirconium alloy from 99% by weight niobium and 1% by weight zirconium.

15. A method of fabricating a thermocouple, comprising:
  forming a thermocouple junction by swaging an end of a first thermoelement wire and an end of a second thermoelement wire formed from thermoelectrically dissimilar materials with a metallic tube;
  heating a first insulating material, a second insulating material, and a third insulating material at a sufficient temperature and time to remove moisture and impurities contained therein;
  threading the first thermoelement wire through a first passageway formed in the first insulating material and threading the second thermoelement wire through a second passageway formed in the first insulating material;
  disposing the first insulating material, the second insulating material, and the third insulating material within a metallic sheath, comprising:
    forming an interface between the second insulating material and the third insulating material; and
    positioning the thermocouple junction within a void formed in the first insulating material and another void formed in the second insulating material;
  swaging the sheath so that the first insulating material and the second insulating material contact the first thermoelement wire, the second thermoelement wire, and the thermocouple junction;
  cutting the thermocouple at a location between the thermocouple junction and the interface between the second insulating material and the third insulating material to form a sheath end; and
  capping the sheath end with an end plug.

16. The method of claim 15, further comprising heating the capped thermocouple at a sufficient temperature and time to stabilize a grain structure of the thermocouple.

17. The method of claim 15, further comprising forming the first insulating material and the second insulating material from hafnia.

18. The method of claim 15, further comprising forming the third insulating material from alumina.

19. The method of claim 15, further comprising determining the location of the thermocouple junction and the interface between the second insulating material and the third insulating material by x-ray imaging.

20. The method of claim 15, wherein capping of the sheath end with an end plug comprises laser welding a niobium plug onto the sheath end.

21. The method of claim 15, further comprising forming the sheath from a niobium and zirconium alloy.

22. A thermocouple produced by the method of claim 15.

23. The method of claim 15, further comprising forming the first thermoelement wire from molybdenum doped with elements selected from the group consisting of tungsten, potassium and silicon.

24. The method of claim 23, wherein forming the first thermoelement wire from molybdenum doped with elements selected from the group consisting of tungsten, potassium and silicon comprises forming the molybdenum with doped elements that are present in amounts ranging from between 100 to 300 parts per million.

25. The method of claim 15, further comprising forming the second thermoelement from a niobium and zirconium alloy.

26. The method of claim 25, wherein forming the second thermoelement from a niobium and zirconium alloy comprises forming the niobium and zirconium alloy from 99% by weight niobium and 1% by weight zirconium.

27. A high-temperature thermocouple, comprising:
  a thermocouple junction between a first thermoelement wire comprising a doped molybdenum and a second thermoelement wire comprising a niobium and zirconium alloy;
  a first electrical insulating material comprising:
    a first longitudinal passageway and a second longitudinal passageway formed therein, wherein the first thermoelement wire is at least partially disposed in the first longitudinal passageway and the second thermoelement wire is at least partially disposed in the second longitudinal passageway; and
    a void formed in the first electrical insulating material for receiving a portion of the thermocouple junction;
  a second electrical insulating material comprising a void for receiving a portion of the thermocouple junction;
  a sheath comprising a niobium and zirconium alloy having the first electrical insulating material, material and the second electrical insulating material at least partially disposed therein, wherein the thermocouple junction is at least partially positioned within the void of the first electrical insulating material and the void of the second electrical insulating material, and wherein the first electrical insulating material and the second electrical insulating material is at least partially in contact with the first thermoelement wire, the second thermoelement wire, and the thermocouple junction; and
  an end plug disposed on an end of the sheath proximate to the thermocouple junction.

* * * * *

UNITED STATES PATENT AND TRADEMARK OFFICE
CERTIFICATE OF CORRECTION

PATENT NO. : 7,871,198 B2  Page 1 of 1
APPLICATION NO. : 11/678901
DATED : January 18, 2011
INVENTOR(S) : Joy L. Rempe et al.

It is certified that error appears in the above-identified patent and that said Letters Patent is hereby corrected as shown below:

In the specification:
COLUMN 5, LINE 5, change "to ensure assure stable" to
--to ensure stable--

In the claims:
CLAIM 27, COLUMN 8, LINE 42, change "insulating material, material and" to
--insulating material and--

Signed and Sealed this
Thirty-first Day of May, 2011

David J. Kappos
*Director of the United States Patent and Trademark Office*